United States Patent
Zinn et al.

(10) Patent No.: US 6,921,707 B1
(45) Date of Patent: Jul. 26, 2005

(54) LOW TEMPERATURE METAL OXIDE COATING FORMATION

(75) Inventors: Alfred Zinn, Palo Alto, CA (US); David Scott, Bakersfield, CA (US)

(73) Assignee: Ultramet, Pacoima, CA (US)

( * ) Notice: Subject to any disclaimer, the term of this patent is extended or adjusted under 35 U.S.C. 154(b) by 0 days.

(21) Appl. No.: 09/979,929

(22) PCT Filed: May 26, 2000

(86) PCT No.: PCT/US00/14620

§ 371 (c)(1),
(2), (4) Date: Nov. 27, 2001

(87) PCT Pub. No.: WO00/73534

PCT Pub. Date: Dec. 7, 2000

Related U.S. Application Data

(60) Provisional application No. 60/136,694, filed on May 28, 1999.

(51) Int. Cl.[7] .......................... H01L 21/20; H01L 21/36
(52) U.S. Cl. ...................................... 438/496; 438/935
(58) Field of Search ................. 438/469, 502, 438/507, 509, 530, 935

(56) References Cited

U.S. PATENT DOCUMENTS 5,351,328 A  *  9/1994  Kakii et al. ................... 385/83

* cited by examiner

*Primary Examiner*—Phuc T. Dang
(74) *Attorney, Agent, or Firm*—Bruce A. Jagger

(57) ABSTRACT

A process for forming metal oxides, including mixed metal oxides, in a dilute vapor phase at a temperature below approximately 350 degrees Fahrenheit. The resulting novel oxides can be formed as dense films or coatings with very high strain-to-crack values, or as nanoparticles, depending primarily upon the concentration of the reactants. The novel oxides are formed by the reaction in the vapor phase of reactive metal molecules with atomic oxygen. The reactions are instantaneous at room temperature, which permits this process to be applied to the formation of metal oxides on temperature sensitive substrates. The atomic oxygen and highly reactive metal containing molecules are generated by the application of an effective amount of ultraviolet radiation.

19 Claims, No Drawings

LOW TEMPERATURE METAL OXIDE COATING FORMATION

This application is a 371 of PCT/US00/14620 filed May 26, 2000, which claims benefit of Provisional Application 60/136,694 filed May 28, 1999.

BACKGROUND OF THE INVENTION

1. Field of the Invention.

The invention relates in general to the low temperature formation of metal oxides, including mixed metal oxides, and to the oxides so formed. In particular the invention relates to the formation of dense metal oxide films and nanoparticles, and to the films and nanoparticles so formed.

2. Description of the Prior art.

Previous workers have proposed to prepare metal oxides, and particularly metal oxide films, according to various procedures. In general, these prior expedients involved relatively high temperatures and harsh conditions that precluded practicing them to form such oxide coatings on substrates that tend to degrade at elevated temperatures. Thus, it was generally considered impossible to form metal oxide films on substrates such as, for example, temperature sensitive organic polymers, wood, paper, cotton, and the like. Deposition of oxides onto carbon and other oxidation sensitive substrates was also relatively ineffective due to elevated temperature oxidation and degradation of the substrate material during the deposition process. Previous expedients generally required the use of temperatures in excess of at least 300 and generally 500 degrees Centigrade.

Prior expedients generally did not produce fully dense metal oxide layers unless formed at or annealed at least 500 degrees Centigrade. Also, prior expedients did not produce pure metal oxide coatings. In general, some of the reactants were trapped in the coatings, which required the application of high temperatures to drive them off. Prior metal oxide forming procedures were often surface controlled in that the temperature of the surface upon which the oxide was to be formed was raised to a reaction temperature. The reactants reacted on or at the surface, driven by the elevated temperature of the surface, rather than in the vapor phase surrounding the surface. No reaction could take place without contact with the heated surface. This dictated that only temperature tolerant surfaces could be coated.

Metal oxide films, including mixed metal oxide films, enjoy application as hard surfaces, thermal and corrosion barriers, and the like. For a number of these applications, porosity in such films is highly undesirable because it provides a way for the environment to attack the underlying substrate. The production of fully dense films had generally been very difficult, if not impossible to achieve. For some applications, porosity or fractalization of the films can be beneficial, and a process that provides controllable morphology of the deposited oxides would, then, be of benefit. Metal oxide films generally suffered from the problem that they were very brittle. Thus, they tended to fracture and fail to provide the benefit for insoluble, and various expedients were resorted to in an effort to protect such coatings from conditions where their brittle nature would cause them to fail. This greatly limited the usefulness of such films or coatings.

It had generally been considered to be very difficult if not impossible to produce metal oxide nanoparticles, that is, particles having an average diameter of less than 100, and preferably less than 20 nanometers or even 15 nanometers. Such nanoparticles have very desirable properties for various applications, including, for example, compaction into various composite articles. They have extremely high surface to volume ratios that provide advantageous benefits as catalyst supports. Nanoparticles or nanocrystalline structures also possess unique mechanical properties that can provide advantageous performance.

Those concerned with these problems recognize the need for an improved low temperature metal oxide forming process, and the benefits to be derived from the products produced by such a process.

BRIEF SUMMARY OF THE INVENTION

A preferred embodiment of the present invention comprises the formation of a novel metal oxide, including mixed metal oxides, by allowing atomic oxygen and a carbon free reactive metal containing molecule or radical to react in the vapor phase. As used herein in context with this metal containing reactant, "molecule" is inclusive of "radical", because the exact nature of the reactant or reactants has not been established with absolute certainty. Without intending to be bound by any theory, it is believed that exposing the vapor phase mixture to an effective level of photo-energy having wave lengths that excite the oxygen providing molecule to generate atomic oxygen and the metal precursor compound to generate a vapor phase reactive metal containing molecule provides the necessary reactants to form metal oxides at low temperatures. The amount and wave length of photo energy that is effective to break any particular bond is well known in the art. The atomic oxygen and the reactive metal containing molecule are generated by breaking the bonds of an oxygen providing molecule and a reactive metal precursor with photo-energy, namely ultraviolet (UV) light. Other wavelengths that couple directly with specific bonds may be considered, but UV is considered preferable for activating a broad range of molecules. The energy output of the UV source, for example, lamp or laser, is tailored to emit an amount of energy at the proper wavelengths that is effective to break the bonds of the source reagents. The resultant reactants are extremely reactive even at room temperature. They are generated in the vapor phase, and they react in the vapor phase. The reaction is not surface dependent, that is, the energy for breaking the bonds that result in their generation comes from photo-energy rather than the thermal energy of a heated surface. Since the reaction takes place in the vapor phase, it is possible, by adjusting the reaction parameters, to produce either a very dense, or porous, or fractalized film on a substrate, or a nanopowder in the vapor. In general, lower concentrations of reactants favor the production of films. By producing the reactive metal molecule from a carbon free source, contamination of the metal oxide with carbon is avoided. Contamination of the oxide by, for example a halogen, example, from 0.1 to 5 mole percent over the stoichiometric amount, of the atomic oxygen source. Large excesses of the oxygen source beyond a few mole percent serve no useful purpose and are wasteful of reagents. Such large excesses, generally, however, are not harmful provided that the excess is not sufficient to create a safety hazard, e.g., by creating potentially explosive mixtures. By contrast, an excess of the metal precursor generally degrades the metal oxide by contaminating it with unwanted reaction products.

The objective of the present invention is to produce, preferably at a low temperature either a fully dense tightly adhered metal oxide coating on a substrate, a controlled porosity or fractalized metal oxide coating on a substrate or very fine metal oxide powders (nanoparticles). The metal oxide deposits range in their characteristics along a continuum between the tightly adhered fully dense coating and the fine powders, depending on the conditions of formation. The metal oxides that can be formed according to the present invention include mixed metal oxides. Whether coatings or nanoparticles are produced depends on the conditions of reaction. The metal oxide coatings have strength, ductility and other characteristics that have not been possible to achieve following prior practices. The preferred coatings are strong, ductile, tightly adhered to the substrate and non-porous. The powders are very fine and nano-crystalline in nature. The powders are particularly useful in the manufacture of ceramics.

The formative reaction for the metal oxide is believed to be between atomic oxygen and a highly reactive metal reactant molecule. The reactive atomic oxygen can be produced by UV decomposition of externally produced ozone and/or by decomposition of ozone from the environment. The ozone is diluted, generally with oxygen, to keep the ozone at a concentration that is below the explosive limit at all stages in the process from its generation to its consumption within the reaction zone. Generally, this is below about 15 mole percent at 15 pounds per square inch. Exclusive of the generation of the atomic oxygen from ozone or oxygen, two different reactions are generally required to produce the coatings or powders.

First, an effective level of photo-energy, preferably in the form of UV light or, in selected cases, other photo-energy wavelengths of sufficient intensity, is used to irradiate the vapor phase in a reaction zone. The irradiation produces a highly reactive metal reactant molecule by breaking some of the bonds in a metal precursor compound. Second, the metal reactant molecule reacts with atomic oxygen to produce a metal oxide. This second reaction is not dependent upon irradiation to drive it. It proceeds equally well in areas that are and are not exposed to irradiation. Both reactions are instantaneous at or about room temperature.

The wavelength of the photo energy, e.g., UV light, is selected so that it breaks bonds to generate atomic oxygen, preferably from ozone, and also to generate a metal reactant molecule from a metal precursor compound. Potential bonds that may be of interest that lie outside of the conventional ultraviolet wavelength range include, for example, hydrogen-Iodine (402 nm), chlorine-chlorine (493 nm), HO—HO (562 nm), and bromine-bromine (621 nm).

The first reaction, to produce a highly reactive metal reactant molecule, is required because the reaction between the metal precursor compound and the atomic oxygen does not produce a significant amount of a metal oxide coating or powder. A more reactive metal bearing molecule or radical is required.

All of the reactions proceed very rapidly at room temperature even with dilute ozone once the precursor regents have been exposed to UV light of the desired wavelength.

The reaction takes place in the vapor phase and the reactant concentration must be carefully controlled. Concentration is believed to be the primary determiner of whether powders or films are produced. In general, increasing the concentration of the reactants above a certain value tends to favor the generation of nanopowders instead of coatings. The concentration is controlled by controlling the pressure in the reaction zone, and the feed rate of the reactants to the reaction zone. If the pressure and feed rates are held constant the concentration will remain the same without regard to the volume of the reactor. Changing the volume of the reactor Feed rates of from about 100 to 2000 liters per hour (at standard conditions of 20 degrees Centigrade and 1 bar pressure) for all of the reactants combined are preferred. Pressures in the reaction zone of less than approximately 50 torr are preferred. In general, up to a point, higher oxide formation rates and purer oxides are achieved with higher feed rates. In general, superior films are formed at feed rates of from about 200 to 600 liters per hour (at standard conditions). Above this range the film density and purity appear to degrade slightly. The nanoparticles appear to be capable of being produced at feed rates of up to as much as 2000 liters per hour (at standard conditions). The reactants must be in the vapor phase so that the reaction can proceed rapidly and uniformly with uniformly dispersed reactants. The stoichlometry should be controlled so as to produce the desired pure metal oxide product. Temperature must be carefully controlled All of these conditions are important in achieving the desired oxide product. It is also preferable to establish a flow regime where the flow is as laminar as possible, particularly where films are to be produced.

The concentration of the active reactants (radicals) is minimized because they are very reactive. Inert diluent gases such as, for example, argon, helium, carbon dioxide, or the like, can be used if desired.

Because the reactions are instantaneous in the vapor phase, it is necessary that the reactants be in molecular or near molecular dispersion. The ozone is a gas, so it is fully dispersed. The metal precursor compounds are chosen so that they either have a high vapor pressure or are capable of being dispersed in a volatile solvent to a near molecular dispersion (aerosolized). Suitable precursor molecules include, for example, the metal halide precursors and the like. Because of expense and availability considerations the chlorides are generally preferred, although fluorine, bromine and iodine can be used, if desired. Suitable metals are main group or transition metals, excluding semiconductors, with the well recognized conventional division between metals and semiconductors. Mixtures of various metal precursor compounds can be used if it is desired to produce mixed metal oxide coatings or particles. Such mixed metal oxides include, for example, mixed metal oxides of, for example, zirconium, yttrium, cerium, magnesium, aluminum, titanium, hafnium, tantalum, or the like produced, for example, from mixtures of the corresponding metal halides.

The proportions of the reactants are adjusted dependent upon the desired purity of the product. If highly pure oxides are desired, the oxidizer, e.g., ozone, is provided in slight stoichiometric excess, preferably from approximately 0.1 to 5 mole percent excess. This tends to very greatly minimize or eliminate the contamination of the oxide films and nanoparticles by reaction products such as chlorine.

The temperature of the substrate is preferably kept as low as possible so as to avoid degrading the substrate. Various substrate materials that benefit greatly from metal oxide coatings degrade at temperatures that are only a little above about room temperature, for example, approximately 0 to 125 degrees Fahrenheit. Other substrate materials degrade below approximately 350 degrees Fahrenheit. Low temperature deposition also reduces the tendency for cracking or spalling in the as-deposited condition of coatings that have a substantial difference of thermal expansion coefficient between that of the coating and that of the substrate. The metal oxide deposits according to the present invention are formed at low temperatures, that is, from approximately 0 to 350 degrees Fahrenheit. In general, no benefit is to be had by operating at higher temperatures. In particular, substrates in the form of particles, fibers, filaments, films, foams, fiber bundles, fabrics, lay-ups, rough surfaces, smooth surfaces, porous surfaces, solid surfaces, and liquid surfaces, and the like, are particularly benefited by being coated with a metal oxide coating according to the present invention. The solid substrates can be composed, for example, of metals, alloys, polymers, glass, paper, wood, carbon, cotton, graphite, silicon carbide, ceramic, or the like, with solid or porous surfaces. The nature of the substrate is generally not critical, except that many materials, that are normally present when oxides are formed, can be coated according to the present invention. The solid substrates with the applied metal oxide coating are particularly suited for use as reinforcements in composites. The oxide coatings also serve, for example, as hard coatings, thermal barriers, corrosion protective coatings, interfacial coatings on composite reinforcement fibers or filaments, optical coatings, and the like. The thin flat oxide films that are produced by deposition on a liquid surface can be, for example, removed and used for other purposes. Because of the low surface temperatures there are generally few, if any, reactions between the substrate and the coating or the reactants. The temperature excursions that are experienced according to the process of the present invention are small or non-existent, so differences in thermal expansion rates do not tend to cause the coating to crack or flake off. Such metal oxide coatings have an elongation (strain-to-crack) of at least as much as about 0.3 and preferably 0.8 to 1 percent or more, as compared with about 0.1 percent or less for the same metal oxides formed by other means. The oxide coatings deposited by this method also show signs of permanent deformation, such as "wrinkling", that suggests relatively ductile behavior not consistent with that typically exhibited by oxides.

If the concentration of the reactants is increased beyond a certain level, first porous or fractalized coatings and, ultimately, powders will begin to be produced. Once the point has been reached where powders are formed, increasing the concentration tends to increase the size of the particles. The nanoparticles are formed at low temperatures so they can be recovered without any of the size increase or degradation that generally occurs when nanoparticles are exposed to high temperatures. Care must generally be exercised in collecting and handling such small particles (generally less than 100 and preferably less than about 20 nanometers in average diameter). They can, for example, be collected in a foam filter and The required photo-energy, e.g., UV wavelengths are determined, as is well known, by the nature of the bonds that are to be broken to initiate the desired reactions. The necessary wavelengths for exciting the bonds in the metal precursor compounds are dependent upon the particular metal precursor compound.

The photo-energy can be supplied by any well known source. Such sources include, for example, UV lamps and lasers. Lasers have an advantage in that they can be tuned to the exact frequency that is required to break the bond in question. However, for concurrent reactions that require different wavelengths, broad bands covering a spectrum of radiation can be advantageous. UV lamps generate energy over a spectrum of some considerable width with peaks at the desired wavelengths.

The intensity of the UV or photo-energy is commonly characterized in terms of watts at the desired wavelengths. The amount of energy that reaches the reactants is dependent upon many factors such as the output of the lamp, losses through intervening structures and environment, and the distance from the lamp to the reactor. In general the reaction zone receives an effective amount of photo-energy from a lamp spaced from about 2 to 7 inches from the reactor wall that is capable of putting out from 100 to 600 watts at the desired frequencies, for example, 220 to 260 nanometers. Preferably, more than one lamp is used so as to illuminate the reaction zone as uniformly as possible. Where the reaction zone is lengthy, for example, several feet, it may be desired to space several lamps along the length of the reaction zone.

The UV energy is directed in a coating operation so that it impinges upon the active reactants before they reach the surface that is to be coated. Preferably, the active reactants are exposed to the bond breaking ultraviolet energy close to the surface that is to be coated, because the reactions apparently take place instantaneously. Since the coatings readily form as much as one inch inside of reticulate foam objects, where there is no exposure to ultraviolet energy, it is believed that it is not necessary that the UV energy impinge directly on the surface that is to be coated.

The flow regime has some influence on the nature of the product. Laminar flow tends to favor the formation of tightly adherent plating, and turbulent flow tends to favor the formation of a nanopowder.

The metal oxide coatings produced according to the present invention are very dense and pore free. Several tows of silicon carbide fibers containing approximately 1800 individual filaments per tow with an average diameter of about 14 microns were coated with various metal oxides in a reaction chamber 16 inches long and 3 inches in outside diameter. The oxide coated tows were removed from the reactor and suspended from hooks. A constant static load of 21.4 MPa (3.1 kis) was applied to each tow. Each tow was subjected to a 1200 degree Centigrade oxidizing flame. An uncoated tow failed in 48 minutes. A zirconium oxide coated tow failed in 6.4 hours. A tantalum oxide coated tow failed in 6.1 hours.

In order to determine the effect of the coating on the strength of the fibers, tows of silicon carbide fibers coated with titanium oxide, zirconium oxide, hafnium oxide and tantalum oxide, respectively, were subjected to a continuous stream of argon at a temperature of 1235 degrees Centigrade in a tube furnace for one hour. As compared to an uncoated tow, which had been subjected to the same conditions, the strengths of the coated tows were approximately 50 percent higher than that of the untreated tow.

The strain-to-crack values of tantalum oxide, zirconium oxide and hafnium oxide coatings were evaluated by a simple bend test that introduced outer surface tensile strains in the bent filaments and coatings. Six round rods of varying diameters were selected to provide different strains when the filaments were bent around these rods. The rod diameters and associated strains in a thin coating for a 14 micron diameter filament were as follows: 0.23 inch–0.479 percent strain, 0.20 inch–0.551 percent strain, 0.17 inch–0.648 percent strain, 0.13 inch–0.848 percent strain, 0.10 inch–1.102 percent strain, 0.08 inch–1.378 percent strain. Coated filaments were bent around the respective bars. A hafnium oxide coating about 0.1 microns thick on a silicon carbide filament experienced no cracking at a strain of 1.4 percent, although some wrinkling of the coating strain of 1.4%, but was uncracked at 1.1 percent. Thicket coatings of zirconium oxide cracked at a strain of 0.85 percent. These bulk oxide materials have strains-to-crack capacities at best of no higher than about 0.1 percent.

Repeating these tests, using a nominal coating thickness of 0.1 microns, shows that the strain-to-crack values of coatings of zirconium oxide, yttrium oxide, cerium oxide, magnesium oxide, aluminum oxide, titanium oxide, hafnium oxide, and tantalum oxide are all greater than 0.5 percent. Mixed metal oxide coating s exhibit substantially the same characteristics.

EXAMPLE 1

A standard vertically mounted quartz glass chemical vapor deposition reactor (2 inch outside diameter, 4 feet long with a wall thickness of about 2 millimeters) was equipped with a chlorination container loaded with 400 grams of titanium metal turnings, and two ¼ inch stainless steel feed gas inlet tubes, one with a "shower head" for the ozone gas mixture. The chlorine gas was fed directly into the chlorination container at a rate of about 45 cubic centimeters per minute. The chlorination was carried out at 500 degrees Centigrade. The resultant flow of titanium chloride (believed to be titanium trichloride) was fed directly to the reactor. Pure oxygen was fed into a standard air-cooled ozone generator with an output of 2 pounds per 24 hours. At nominally 15 pounds per square inch gauge pressure, a gas mixture containing approximately 3.5 mol percent ozone was generated. The resulting $O_3/O_2$ gas mixture was fed directly into the reactor directly above the to be coated substrate. The chemical vapor deposition reactor was kept at a pressure of less than about 1 torr. The formed titanium chloride and the oxygen/ozone gas mixture made first contact in the area approximately 1 inch below the shower head.

A 10 inch long fiber tow of silicon carbide fibers was placed on a hook directly beneath the shower head so that the tops of the fibers were located about 3 inches below the shower head. The fiber bundle (tow) contained approximately 2000 individual silicon carbide filaments. The uncoated filaments had an average diameter of about 14 microns, and a generally circular cross-section.

The to be coated fiber tow was illuminated using a low pressure mercury lamp to generate the required ultraviolet radiation. The mercury lamp generated a broad spectrum of ultraviolet light having wavelengths ranging from 250 to 600 nanometers. The intensity of the ultraviolet was varied from the top to the bottom of the tow by positioning the lamp at an angle to the reactor so as to change the intensity of the energy source along the tow. The lamp was positioned closer to the tow at the lower end. The increasing intensity at the lower end was provided to accommodate the decrease in the concentration of the reactants as they flowed down the length of the vertically hung tow. It was determined that this variation in UV intensity had no significant effect on the nature of the metal oxide deposits. Two lamps were used, one on each side of the reactor. The ultraviolet light caused molecular activation of the reactants.

The reactants were shielded from exposure to ultraviolet light until they were mixing in the region about an inch above the tow. The reactants are so reactive that it was necessary to dilute them by using very low pressure in the chamber. The temperature of the tow, as measured by a thermocouple positioned against the tow about at its midpoint, was about 20 degrees Centigrade.

A uniform coating of titanium dioxide was achieved over the entire length of the fiber tow with a processing time of about 10 minutes. The thickness and other characteristics of the resulting titanium dioxide coating throughout the cross-section of the tow. The tightly adhered coating was about 0.1 microns thick, and consisted of nano-crystals, very uniformly distributed over the entire tow and throughout the thickness of the tow on each individual filament. The titanium dioxide coating contained less than one percent chlorine. Repeating this Example 1, but extending the processing time to 30 minutes increased the coating thickness to about 0.5 microns.

The reactions that took place at the surfaces of the work pieces to form the coatings are believed to be as follows:

$$2O_3 + UV(hv, 254nm) \rightarrow 2O_2 + 2O$$

$$2TiCl_3 + UV(hv) \rightarrow 2TiCl_2 + Cl_2$$

$$TiCl_2 + 2O \rightarrow TiO_2 + Cl_2$$

These reactants all have high vapor pressures so they are readily volatilized. The ozone was provided in slight stiochiometric excess. The atomic oxygen and the $TiCl_2$ are highly reactive. All of these reactions took place instantly at about room temperature.

This process is very energy efficient because high temperatures are not used.

Repeating this Example 1 positioning the tow at various levels from 2 to 4 inches below the shower head produced substantially the same results at each position.

Repeating this Example 1 using a 10 inch long tow of carbon fibers containing about 12,000 filaments resulted in the formation of a substantially uniform titanium dioxide coating throughout. The carbon filaments had a generally round cross-section and an average diameter of about 6 to 7 microns. Repeating this Example 1 replacing the fiber tow with 8 inch long ¼ inch wide strips of plastic foil results in substantially the same uniform titanium dioxide coating on the surfaces of the foil. Likewise, using similar strips of paper produces substantially the same results. This Example 1 is repeated using small flat wooden discs (¼ inch thick with a diameter of 1 inch) as the work pieces to be coated. These wooden discs are placed on a graphite holder with its top located approximately 3 inches below the shower head. The faces of the discs are placed parallel to the direction of the flow of the reactants. The resulting uniform coatings of highly pure $TiO_2$ are substantially the same as those formed on the filament tows.

EXAMPLE 2

The procedures and setup of Example 1 were repeated using 400 grams of zirconium metal sponge in place of the titanium metal. The chlorine was fed directly into the chlorination container at a rate of 20 to 45 cubic centimeters per minute. The chlorination was carried out at 600 to 700 degrees centigrade. The $O_3/O_2$ gas mixture was fed into the reactor directly above the to be coated substrate. The reactions were believed to be as follows:

$$2O_3 + UV(hv, 254nm) \rightarrow 2O_2 + 2O$$

$$ZrCl_4 + UV(hv) \rightarrow ZrCl_2 + Cl_2$$

$$ZrCl_2 + 2O \rightarrow ZrO_2 + Cl_2$$

The $ZrCl_4$ and the oxygen/ozone gas mixture made first contact in the area just below the shower head at about the same location where they were first exposed to ultraviolet radiation. A 10 inch long fiber tow of silicon carbide was placed on a hook at the shower head so that the top was located about 2 inches below it. The to be coated fiber tow was illuminated using low pressure mercury lamps, as described in Example 1. The temperature of the tow during coating was about 20 degrees centigrade. Uniform coating was achieved over only the top 3 to 5 inches of the fiber tow. The coating was non-uniform on the lower 5 to 7 inches of the tow, with greater irregularity occurring in the area of the filaments furthest removed from the shower head. The coatings Consisted of highly pure $ZrO_2$ with less than 1 percent chlorine. The coatings were tightly adhered to the silicon carbide filaments uniformly across the thickness of the tow. The coatings were nano-crystalline and very uniform. After 20 minutes of deposition time the coatings had a thickness of about 0.1 microns. Coatings of about 0.5 microns in thickness were formed in less than 60 minutes. Fiber bundles with 2000 filaments having an average diameter of about 14 microns were used.

Repeating this Example 2 using carbon tow containing approximately 12,000 filaments having an average thickness of about 6 to 7 microns produced substantially similar results.

Repeating this Example 2 positioning the tow from 2 to 4 inches below the shower head produced substantially the same results at each position.

EXAMPLE 3

The procedures and setup of Example 1 were repeated using 400 grams of hafnium metal chips in place of the titanium-metal. The chlorine was fed directly into the chlorination container at a rate of 20 to 45 cubic centimeters per minute. The chlorination was carried out at 600 to 700°C. The $O_3/O_2$ gas mixture was fed into the reactor directly above the to be coated substrate. The formed $HfCl_4$ and the oxygen/ozone gas mixture made first contact in the area just below the shower head. An 8 inch long fiber tow of silicon carbide filaments was placed on a hook at the shower head so that the top was located about 3 inches below it. The to be coated parts were illuminated using two low pressure mercury lamps to generate the required ultraviolet radiation for reactant molecule activation. The tow was at about 20 degrees centigrade during the deposition. The reactions involved were believed to be as follows:

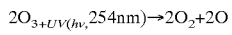
$2O_{3+UV(hv,}254nm) \rightarrow 2O_2+2O$

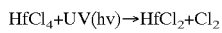
$HfCl_4+UV(hv) \rightarrow HfCl_2+Cl_2$

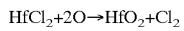
$HfCl_2+2O \rightarrow HfO_2+Cl_2$

A uniform coating of tightly adhered $HfO_2$ was achieved over the uppermost 5 to 7 inch length of the fiber tow. The coatings on the lower 1 to 3 inches of the tow were not uniform with some areas at the lowest end of the tow being substantially uncoated. The coatings consisted of highly pure $HfO_2$ with less than 5 percent chlorine. The coatings were nano-crystalline and very uniform in both the length and cross-section of the tow. The coatings were about 0.1 microns thick after about 20 minutes of processing. Coatings about 0.5 microns thick were formed in about 60 minutes. The SiC fiber tow contained about 2000 filaments which had an average diameter of about 14 microns each. Repeating this Example 4 using carbon fiber tows containing approximately 12,000 filaments with an average diameter of about 6 to 7 microns produced substantially the same coatings.

EXAMPLE 4

The procedures and setup of Example 1 were repeated using 400 grams of tantalum metal turnings in place of the titanium metal. The chlorine was fed directly into the chlorination container at a rate of 20 to 45 cubic centimeters per minute. The chlorination was carried out at 500 to 600°C. The $O_3/O_2$ gas mixture was fed into the reactor directly above the to be coated substrate. The formed $TaCl_5$ and the oxygen/ozone gas mixture made first contact in the area just below the shower head. A 10 inch long fiber tow of silicon carbide filaments was placed on a hook at the shower head so that the top was located about 3 inches below it. The to be coated parts were illuminated using low pressure mercury lamps to generate the required ultraviolet radiation for reactant molecule activation. The tow was at about 20 degrees centigrade during the deposition.

A uniform coating of tightly adhered $Ta_2O_5$ was achieved over the uppermost 6 to 8 inch length of the fiber tow. The coatings on the lower 2 to 4 inches of the tow were not uniform with some areas at the lowest end of the tow being substantially uncoated. The coatings consisted of highly pure $Ta_2O_5$ with less than 1 percent chlorine. The coatings were nano-crystalline and very uniform in both the length and cross-section of the tow. The coatings were about 0.1 microns thick after about 15 minutes of processing. Coatings about 0.5 microns thick were formed in about 45 minutes. The SiC fiber tow contained about 2000 filaments which had an average diameter of about 14 microns each. Repeating this Example 4 using carbon fiber tows containing approximately 12,000 filaments with an average diameter of about 6 to 7 microns produced substantially the same coatings.

The feed rate parameters for a process run in a 16 inch long reactor having a 3 inch outside diameter are set forth below in Table I.

TABLE I

| Feed Parameter | Value |
| --- | --- |
| Total feed (liters/minute) | 5.23 |
| Ar (liters/minute to $O_3$ generator) | 0.065 |
| Ar (grams/minute) | 0.109 |
| $O_2$ (liters/minute to $O_3$ Generator) | 5.1 |
| $O_2$ (grams/minute) | 6.6 |
| $Cl_2$ (liters/minute to $TiCl_3$ Generator) | 0.038 |
| $Cl_2$ (grams/minute to $TiCl_3$ Generator) | 0.113 |
| $O_3$ (liters/minute to reaction zone) | 0.1785 |
| $O_3$ (grams/minute) | 0.355 |
| $TiCl_3$ (grams/minute to reaction zone) | 0.164 |
| R (gas constant) | 0.08314 |
| Temperature (degrees Centigrade) | 18 |
| Pressure of feed to the reactor(bar) | 1.013 |
| Total moles to the process | 0.217851 |

Table II sets forth the calculated values for the absolute concentrations of gases in the reactor.

TABLE II

| Parameter | Value |
| --- | --- |
| Total feed (liters/minute) | 5.23 |
| Ar (liters/minute to $O_3$ generator) | 0.065 |
| Ar (grams/minute) | 0.109 |
| $O_2$ (liters/minute to $O_3$ Generator) | 5.1 |
| $O_2$ (grams/minute) | 6.6 |
| $Cl_2$ (liters/minute to $TiCl_3$ Generator) | 0.038 |
| $Cl_2$ (grams/minute to $TiCl_3$ Generator) | 0.113 |
| $O_3$ (liters/minute to reaction zone) | 0.1785 |
| $O_3$ (grams/minute) | 0.355 |
| $TiCl_3$ (grams/minute to reaction zone) | 0.164 |
| R (gas constant) | 0.08314 |
| Temperature (degrees Centigrade) | 18 |
| Pressure of feed to the reactor(bar) | 1.013 |
| Total moles to the process | 0.217851 |

Various metal precursors can be mixed together to produce a mixed metal oxide, if desired. Any of the metals which can be used alone to produce a single metal oxide film can be mixed together, if desired.

EXAMPLE 5

The atomic oxygen source can be other than externally provided ozone, if desired. A standard vertically mounted glass chemical vapor deposition reactor was equipped with a chlorination container loaded with 400 grams of titanium metal turnings and stainless steel gas inlet tubes. An inert gas/chlorine mixture was feed through one tube, hydrogen through another and oxygen through a third. The chlorine gas carried out at a temperature of about 500 degrees centigrade. The resultant flow of titanium chloride was fed directly to the reactor. Pure diatomic oxygen was fed into the reactor at a rate of 7,800 cubic centimeters per minute. The chemical vapor deposition reactor was kept at a pressure of less than about 30 torr. The deposition temperatures were low as indicated by the fact that the carbon fibers were not degraded by oxidation or other mechanisms.

A 10 inch long fiber tow of carbon fibers was placed on a hook within the reactor and was located beneath the gas inlet tubes from the chlorination chamber. The carbon fiber bundle (tow) contained approximately 3,000 individual filaments. The individual filaments had an average uncoated diameter of about 7 microns.

The to be coated fiber tow was illuminated using a low pressure mercury lamp to generate ultraviolet radiation. The mercury lamp generated a broad spectrum of ultraviolet photo energy having wavelengths ranging from 250 to 600 nanometers. Without intending to be bound by any theory, it is believed that the ultraviolet photo energy acting on the oxygen in the reaction zone causes monatomic oxygen to form, some of which reacts to produce a metallic oxide, and some of which apparently reacts to form ozone. Thus, it is believed that ozone is formed even though it is not supplied from a source external to the reaction zone and it may not be the source of the monatomic oxygen active species. References herein to the formation of ozone in the reaction zone are intended to include this mechanism where monatomic oxygen is produced without regard to what the exact transitory reactants may be.

A porous coating of titanium dioxide was achieved over the entire fiber tow within a processing time of about 2 hours. The thickness and other characteristics of the resulting titanium dioxide coating were substantially constant throughout the length of the tow as well as throughout the cross-section of the tow. The coating encapsulated the individual filaments and was about 0.2 microns thick. A coating of this thickness was distributed uniformly over the entire tow and throughout the thickness of the tow on each individual filament.

Repeating the process of this Example using lower oxygen flow rates varies the character of the resultant coating. Reducing the oxygen flow rates by as much as one half produces smoother and more continuous coatings. Doubling the oxygen flow rate tends to produce some free powder. Substantially similar results are achieved by repeating this Example using diatomic oxygen as the oxygen providing molecule to produce zirconium oxide, yttrium oxide, cerium oxide, magnesium oxide, aluminum oxide, hafnium oxide, tantalum oxide, and mixed metal oxides.

EXAMPLE 6

It is possible to produce a satisfactory metal oxide coating with a static body of vapor phase reactants. Even with static reactants it is possible to form uniform coatings throughout a reticulated foam article several inches in thickness. This indicates that the reaction is not dependent upon line of sight activation by the photo energy.

The same vapor deposition chamber apparatus as described in Example 5 above was evacuated to a pressure of less than 1 torr. The chamber was then back filled with reactive gases. The reactive gases were hydrogen, titanium chloride ($TiCl_3$) and diatomic oxygen. Chlorine was fed into a heated chlorinator filed with titanium metal chips at a rate of 50 cubic centimeters per minute. The resultant $TiCl_3$ was allowed to flow directly to the reaction chamber. Hydrogen was fed into the reactor at 20 cubic centimeters per minute. Diatomic oxygen was fed into the reactor at 6500 cubic centimeters per minute. The volume of the reactor was 7500 cubic centimeters. The total pressure was allowed to reach 50 torr in the chamber, and the flow of reactants into the chamber was terminated. At this point the theoretical molar concentrations were 2 moles per liter of $TiCl_3$, 1.2 moles per liter of hydrogen, and 387 moles per liter of diatomic oxygen. The temperature in the chamber was about 28 degrees centigrade. The hydrogen acts as a getter for the chlorine.

A target of recticulated carbon foam having 65 pores per inch was placed in the reactor before it was evacuated. The target was cylindrical with a diameter of 2.25 inches and an axial length of 1.5 inches.

The 48 inch long 3.5 inch inside diameter cylindrical transparent quartz reactor was irradiated from the exterior for about 90 minutes by 2 low pressure mercury lamps (ultraviolet) positioned 180 degrees to one another parallel to the reactor. The lamps were positioned 3 to 4 inches from the exterior chamber wall. The lamps generated 100 watt per inch of tube, and they were 8 inches long. The output of photo energy ranged over a spectrum of 200 to 450 nanometers. After about 90 minutes the target was removed and inspected. It was noted that the exterior of the part on all surfaces appeared to be uniformly coated with a smooth, shinny blue coating of tightly adhered $TiO_2$. The target was bisected and it was observed that the interior of the target had the same appearance throughout as did the outside. The blue coating of $TiO_2$ was uniform throughout the reticulated target. The ligaments of the carbon foam were fully encapsulated.

This static Example was repeated except that the pressure was only allowed to reach 25 torr. Under these conditions less of the reactants were available, but they were in the same proportions. After 90 minutes the target was removed and examined. It was observed that the blue coating that the coating thickness decreased from the core inward until there was no visible coating at the center. The deposition rates for the coatings depend primarily on the concentration of the reactants. At a pressure of 75 torr the reaction causes the formation of a smooth tightly adhered purple to silver white colored deposit. This change in color indicates somewhat thicker coatings. In some instances at pressures above 50 torr a silver white coating was observed on the outside of the reticulated carbon target, changing to a purple coating a few millimeters inside the foam. The color of the coating is very sensitive to small changes in thickness so the color changes from purple to blue or purple to silver white represent a change in thickness of less than approximately 5 percent.

Increasing the pressure in this static system to in excess of approximately 100 torr generates primarily $TiO_2$ powder. As the pressure increases the proportion of powder increases, and the character of the coating changes from a smooth, sealed, tightly adhered coating to a more porous coating.

While not wishing to be bound by any theory, it is believed that a small percentage of monatomic oxygen is being generated in the static vapor system. The large excess of diatomic oxygen is not significant in the reaction because diatomic oxygen is not believed to be the active species. Also, the intermediate reactants through which the metal is provided are not known with certainty. It is believed, however, that $TiCl_3$ and $TiCl_2$ are involved, but $TiCl_4$ or some other reagent may be involved. References herein to titanium chloride are intended to cover all of the reactive species.

It has been observed that stoichiometric excesses of any of the reactants in either the static or constant flow systems tend to change the rate of reaction but not the metal oxides that are produced, provided that contamination is avoided. For this reason it is not particularly critical to maintain stoichiometric proportions. From the standpoint of efficiency and safety, it is generally preferred to operate at or near the stoichiometric proportions. Excess chlorine, for example, is generally undesirable from a safety standpoint, although the hydrogen reacts with it to form HCl, which is easier to handle. Excess reagents are generally just wasted.

The reaction to form a tightly adherent metal oxide costing is clearly not dependent on line of sight with the activating photo energy source in either the static or dynamic systems. While not wishing to be bound by any theory it is believed that the concentration of the reactants primarily determines whether the entire interior of a porous target will be coated. The internal surface area of a porous target is often substantial. At lower concentrations there is not enough reactant available to cover the entire surface of the target. Under these reactant deficient conditions the exterior surfaces appear to be favored.

As will be understood by those skilled in the art, it is necessary to select precursor, particularly metal precursors, that have sufficient vapor pressure to be volatilized at the temperatures (below approximately 350 degrees Fahrenheit) that exist in the reaction zone.

What have been described are preferred embodiments in which modifications and changes may be made without departing from the spirit and scope of the accompanying claims. Many modifications and variations of the present invention are possible in light of the above teachings. It is therefore to be understood that, within the scope of the appended claims, the invention may be practiced otherwise than as specifically described.

What is claimed is:

1. A process for the formation of a metal oxide comprising:
    establishing a continuously flowing stream of a vapor phase mixture with a substantially constant composition at a substantially constant feed rate to a reaction zone, said reaction zone being maintained at a reduced pressure, said vapor phase mixture comprising ozone, and a carbon free metal precursor compound;
    maintaining said reduced pressure at less than approximately 50 torr;
    maintaining the concentration of ozone below the explosive limit at all locations in said process;
    maintaining the feed rate of said vapor phase admixture to said reaction zone at a rate of from approximately 100 to 2000 liters per hour at standard conditions of 20 degrees Centigrade and 1 bar;
    exposing said vapor phase mixture in said reaction zone to an effective level of photo-energy, said photo-energy having wave lengths that excite the ozone to generate atomic oxygen, and the metal precursor compound to generate a vapor phase carbon free reactive metal containing molecule;
    allowing said vapor phase reactive metal containing molecule and said atomic oxygen to react to form a metal oxide; and
    recovering said metal oxide from the reaction zone.

2. A process for the formation of a metal oxide according to claim 1 including providing a plurality of metal precursor compounds in said vapor phase mixture.

3. A process for the formation of a metal oxide according to claim 1 including maintaining the temperature in said reaction zone below approximately 350 degrees Fahrenheit.

4. A process for the formation of a metal oxide according to claim 1 including providing a surface in said reaction zone and allowing said metal oxide to form a film on said surface.

5. A process for the formation of a metal oxide according to claim 2 including forming said ozone in said reaction zone.

6. A process for the formation of a metal oxide according to claim 1 including providing a liquid surface in said reaction zone and allowing said metal oxide to form a film on said liquid surface.

7. A process for the formation of a metal oxide film having a strain-to-crack value of greater than about 0.5 percent when measured at a thickness of about 0.1 microns, said process comprising:
    establishing a continuously flowing stream of a vapor phase mixture with a substantially constant composition at a substantially constant feed rate to a reaction zone, maintaining a reduced pressure in said reaction zone, said dilute vapor phase mixture comprising at least about 0.1 mole percent stoichiometric excess of ozone and a carbon free metal precursor compound;
    maintaining the concentration of said ozone and carbon free metal precursor compound in said reaction zone at a desired value by maintaining said reduced pressure at less than approximately 50 torr, and the feed rate of said vapor phase mixture to said reaction zone at a rate of from approximately 100 to 600 liters per hour at standard conditions of 20 degrees Centigrade and 1 bar;
    exposing said vapor phase mixture to an effective level of photo-energy, said photo-energy having wave lengths that excite the ozone to generate atomic oxygen and the metal precursor compound to generate a vapor phase carbon free reactive metal containing molecule;
    allowing said vapor phase reactive metal containing molecule and said atomic oxygen to react to form a metal oxide film; and
    recovering said metal oxide film from the reaction zone.

8. A process for the formation of a metal oxide film according to claim 7 including providing a solid surface in said reaction zone and allowing said metal oxide film to form on said solid surface.

9. Method of forming a metal oxide comprising:
    generating atomic oxygen in a reaction zone;
    generating a vapor phase carbon free metal containing radical from a metal halide precursor in a reaction zone that is capable of reacting instantaneously with said atomic oxygen;
    flowing a dilute vapor phase mixture comprising said atomic oxygen and said metal containing radical together in said reaction zone; and
    allowing said atomic oxygen and said metal containing radical to react in said vapor phase in said reaction zone to form a metal oxide.

10. A method for the formation of a metal oxide film according to claim 9 including providing ozone from a source external to the reaction zone.

11. Method of forming a metal oxide comprising:
    generating atomic oxygen from ozone in a reaction zone;

generating a vapor phase carbon free metal containing radical from a metal precursor compound in a reaction zone that is capable of reacting instantaneously with said atomic oxygen;

flowing a dilute vapor phase mixture comprising said atomic oxygen and said metal containing radical together in said reaction zone; and allowing said atomic oxygen and said metal containing radical to react in said vapor phase in said reaction zone to form a metal oxide.

12. Method of forming a metal oxide comprising:

supplying ozone from an external source to a reaction zone, generating atomic oxygen in said reaction zone by exposing said ozone to photo energy;

generating a vapor carbon free phase metal containing radical in said reaction zone that is capable of reacting instantaneously with said atomic oxygen by exposing a carbon free metal precursor compound to photo energy;

allowing a dilute vapor phase mixture comprising said atomic oxygen and said carbon free metal containing radical to form in said reaction zone; and allowing said atomic oxygen and said carbon free metal containing radical to react in said vapor phase in said reaction zone at a temperature of less than approximately 350 degrees Fahrenheit to form a metal oxide.

13. A method of forming a metal oxide according to claim 12 wherein said dilute vapor phase mixture is static in said reaction zone.

14. A method of forming a metal oxide of claim 12 wherein said dilute vapor phase mixture has a concentration, and including adjusting said concentration to form a substantially fully dense metal oxide film having a strain-to-crack value of greater than about 0.8 percent when measured at a thickness of about 0.1 microns.

15. A method of forming a metal oxide of claim 12 wherein said dilute vapor phase mixture has a concentration, and including adjusting said concentration to form a porous metal oxide film.

16. A method of forming a metal oxide of claim 12 wherein said dilute vapor phase mixture has a concentration, and including adjusting said concentration to form a fractalized metal oxide film.

17. A method of forming a metal oxide of claim 12 wherein said dilute vapor phase mixture has a concentration, and including adjusting said concentration to form metal oxide nanoparticles having an average diameter of less than about 20 microns.

18. A process of claim 7 for the formation of a metal oxide film having a strain-to-crack value of greater than about 0.5 percent when measured at a thickness of about 0.1 microns, including recovering said metal oxide film having a strain-to-crack value of greater than about 0.8 percent when measured at a thickness of about 0.1 microns.

19. A process of claim 7 for the formation for a metal oxide film having a strain-to-crack value of greater than about 0.5 percent when measured at a thickness of about 0.1 microns, including establishing a continuously substantially laminar flowing stream of said vapor phase mixture.

* * * * *